(12) United States Patent
Schuh

(10) Patent No.: US 8,575,501 B2
(45) Date of Patent: Nov. 5, 2013

(54) HOUSEHOLD APPLIANCE HAVING A USER INTERFACE WITH A USER-EXCHANGEABLE TOUCH WHEEL AND ROTARY ENCODER

(75) Inventor: Eric J. Schuh, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 148 days.

(21) Appl. No.: 13/229,971

(22) Filed: Sep. 12, 2011

(65) Prior Publication Data

US 2013/0062176 A1    Mar. 14, 2013

(51) Int. Cl.
*H01H 19/00* (2006.01)
*H01H 19/11* (2006.01)
*H01H 19/58* (2006.01)

(52) U.S. Cl.
USPC .................................................. 200/11 R

(58) Field of Classification Search
USPC .... 200/11 R, 5 E, 13, 14, 11 C, 19.07, 19.08, 200/19.18, 296, 336
See application file for complete search history.

(56) References Cited

U.S. PATENT DOCUMENTS

| | | | |
|---|---|---|---|
| 5,204,600 A | 4/1993 | Kahkoska | |
| 7,049,714 B2 * | 5/2006 | Tran | 307/137 |
| 7,361,854 B2 * | 4/2008 | Basche et al. | 200/18 |
| 7,745,749 B2 * | 6/2010 | Ito | 200/336 |
| 7,926,964 B2 | 4/2011 | Claprood | |
| 8,164,030 B2 * | 4/2012 | Isoda et al. | 219/489 |
| 8,178,802 B2 * | 5/2012 | Roose et al. | 200/296 |
| 8,237,686 B2 * | 8/2012 | Yoneji | 345/184 |
| 8,330,713 B2 * | 12/2012 | Stelandre et al. | 345/111 |
| 2009/0288512 A1 | 11/2009 | Taylor | |
| 2011/0046815 A1 | 2/2011 | Kindt et al. | |
| 2011/0214978 A1 * | 9/2011 | Byrne et al. | 200/600 |
| 2013/0032456 A1 * | 2/2013 | Nakajima et al. | 200/336 |

FOREIGN PATENT DOCUMENTS

| | | |
|---|---|---|
| EP | 0917170 B1 | 10/2004 |
| JP | 11257999 A | 9/1999 |
| JP | 11327786 A | 11/1999 |
| TW | 200909785 A | 3/2009 |

* cited by examiner

*Primary Examiner* — Edwin A. Leon
*Assistant Examiner* — Anthony R. Jimenez

(57) ABSTRACT

A household appliance having a touch user interface that includes a touch panel with a touch area and a printed circuit board with a capacitive touch switch trace and wherein the printed circuit board is mounted to the touch panel such that the capacitive touch switch trace is aligned with the touch area.

17 Claims, 3 Drawing Sheets

HOUSEHOLD APPLIANCE HAVING A USER INTERFACE WITH A USER-EXCHANGEABLE TOUCH WHEEL AND ROTARY ENCODER

BACKGROUND OF THE INVENTION

Household appliances, examples of which may include a washing machine or a dishwasher, perform cycles of operation and often have electrical and mechanical components responsible for implementing the cycle of operation of the appliance, with one or more of the components controlling the operation of the other components. For example, a controller, such as a microprocessor-based controller, having a printed circuit board (PCB) with memory, may be used to control the operation of the various components to implement a cycle of operation. A user-interface may be provided as part of or separate from the controller to provide input/output communication between a user of the appliance and the controller.

SUMMARY

The invention relates to a user interface for an appliance having a printed circuit board, a face plate overlying the printed circuit board and having indicia corresponding to user inputs, a rotary encoder having a knob located relative to the face plate such that a rotational position of the knob provides for selecting one of the indicia and provides a first output indicative of the selected indicia, and a touch panel having multiple switches located relative to the face plate such that each of the switches corresponds to one of the indicia and provides a second output indicative of selected indicia and where the knob is removably mounted and configured in size and location relative to the multiple switches to block access to the multiple switches thereby providing the user with the ability to select either the rotary encoder or touch panel for user input of the indicia depending on the user's preference by removing or installing the knob.

DESCRIPTION OF EMBODIMENTS OF THE INVENTION

Figure 1:
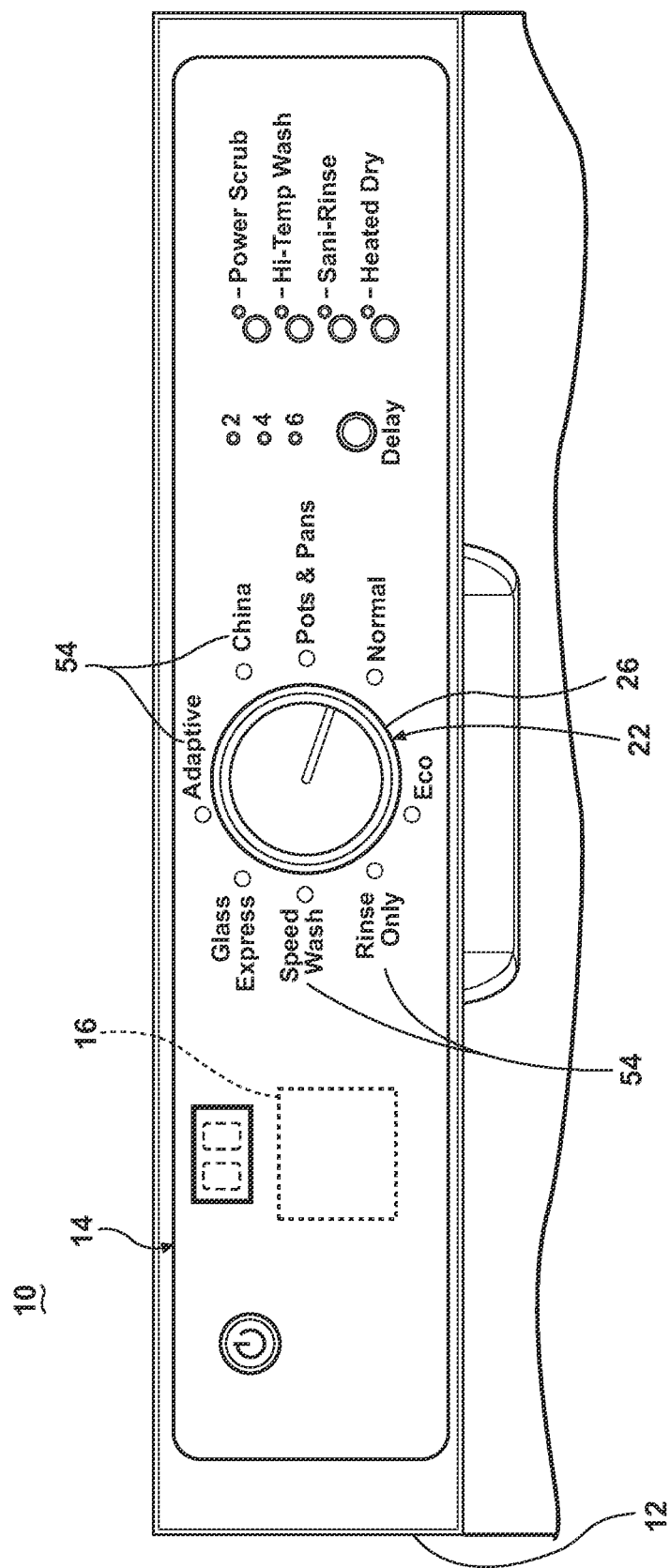
FIG. 1 is a portion of a household appliance showing a user interface according to an embodiment of the invention.

In FIG. 1, a first embodiment of a user interface for a household appliance is illustrated in the appliance environment of an automated dishwasher 10 having a housing 12, a user interface 14, and an associated controller 16 (shown schematically in phantom). The dishwasher 10 shares many features of a conventional automated dishwasher, which will not be described in detail herein except as necessary for a complete understanding of the invention.

The housing 12 may define an interior and may be a frame with or without panels mounted to the frame. The user interface 14 may be mounted on the housing 12 and may include, but is not limited to, a digital display, speakers, a key pad, buttons, switches, lights, knobs, and capacitive touch sensing technology or capacitive touch switches for receiving input from a user. The controller 16 may be operably coupled with the user interface 14 such that it may receive user-selected inputs and communicate information to the user through the user interface 14. In this manner the user interface 14 may be used to select a cycle of operation or to set one or more operating parameters to modify one of the cycles of operation according to the user's preferences and the controller 16 may be operably coupled to various components of the dishwasher 10 to implement the cycle of operation.

It should be appreciated that although the user interface 14 has been illustrated in the environment of a household appliance in the form of a dishwasher 10 that it is contemplated that the household appliance may be any suitable household appliance, non-limiting examples of which include a horizontal or vertical axis washing machine; a horizontal or vertical axis automatic dryer; a combination washing machine and dryer; a tumbling or stationary refreshing/revitalizing machine; an extractor; a non-aqueous washing apparatus; a revitalizing machine, an oven, a microwave oven, and the like.

Figure 2:
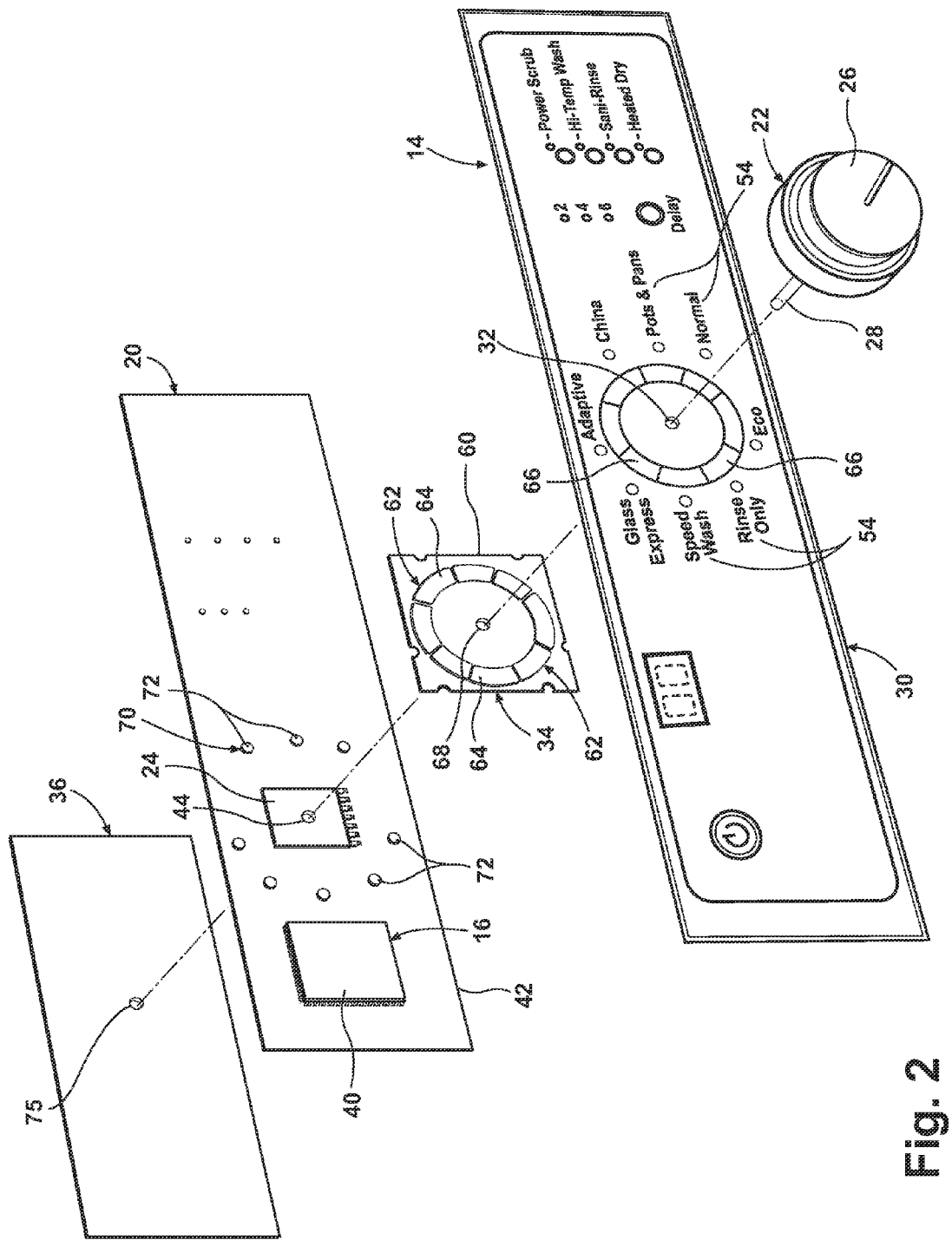
FIG. 2 is an exploded view of an exemplary controller and user interface, which may be used in the dishwasher of FIG. 1.

FIG. 2 illustrates an exploded view of exemplary components, which may make up the user interface 14 and its controller 16. The components collectively include a printed circuit board (PCB) 20, a rotary encoder 22 having an encoder body 24 and a knob 26 having a shaft 28, a face plate 30 having an opening 32 through which the shaft 28 may pass, as well as a touch panel 34, and a back plate 36.

The PCB 20 may have a microprocessor 40 for executing an operating program to implement a cycle of operation. The PCB 20 has been illustrated as including a planar body 42, which may be formed from FR4, or a similar material to which the microprocessor 40 and other various electrical components may be attached. The various electrical components and associated electrical couplings have not been illustrated for clarity purposes of the included illustration. The controller 16 may be formed from portions of the PCB 20 including the microprocessor 40, memory associated therewith (not shown), and the other electrical components. The PCB 20 may also include an opening 44 through which the shaft 28 of the knob 26 may be received.

The rotatory encoder 22 may serve as a user-controlled actuator to allow a user to make selections and provide inputs to the microprocessor 40. The rotary encoder 22 may be a hollow-shaft rotary encoder, as illustrated, or any other suitable type of rotary encoder. Further, the rotary encoder 22 may be implemented as either an absolute or a relative rotary encoder. In the illustrated embodiment, the rotary encoder 22 includes the encoder body 24, knob 26, and shaft 28. The encoder body 24 may be placed around the circumference of the opening 44. The encoder body 24 may be soldered to the PCB 20 or fitted through the opening 44. The encoder body 24 may be operably coupled to the microprocessor 40 and may be configured to transform the rotational position of the shaft 28 into electrical signals, which may be output to the microprocessor 40 to indicate a selection by the user. The knob 26 and shaft 28 of the rotary encoder 22 may have various shapes and/or designs. By way of non-limiting examples, the knob 26 and shaft 28 may be a singular piece or may alternatively be operably coupled together in a suitable manner. The knob 26 may have an axis 50 about which it rotates and it is contemplated that regardless of the configuration of the knob 26 and shaft 28, the rotational axis 50 of the knob may be collinear with a rotational axis of the shaft 28.

The face plate 30 may be a panel intended to overlie the PCB 20 and may include an opening 32 through which the shaft 28 may pass and indicia 54 corresponding to selectable user inputs. The panel forming the face plate 30 may be formed from any suitable material including glass or plastic. The indicia 54 may be applied directly to the face plate 30 such as by printing or painting an indicia layer on the face plate 30. Alternatively, a label (not shown) made of a substantially clear polymeric plastic film, or similar material, with the indicia 54 printed thereon may be adhered or otherwise affixed to the face plate 30. The indicia 54 may be any type of graphic, alphanumeric symbols, shapes, patterns or symbols, which may indicate user selectable cycles of operation and parameters. As illustrated the indicia 54 may be arranged about the opening 32 and may at least partially circumscribe the opening 32. In this manner, the indicia 54 may at least partially circumscribe the rotational axis 50 of the knob 26.

The touch panel 34 may include a body 60 having multiple switches 62 and/or portions of switches that may serve as a second separate user-controlled actuator to allow a user to make selections and provide inputs to the microprocessor 40. The multiple switches 62 may include multiple capacitive touch switches or any other suitable switch that can detect the presence of an object, such as a human appendage, in close proximity to the switch. More specifically, capacitive touch switch traces 64 (shown schematically) have been illustrated on the body 60 and may act as the conductor of such a capacitive switch. The traces 64 may be copper, carbon, silver, or similar conductive materials, which are laid out on the body 60. Each touch switch trace 64 may be associated with a corresponding touch area 66 on the face plate 30. Each of the switches 62 corresponds to one of the indicia 54 and is electrically coupled to the microprocessor 40 to provide a second output indicative of the user's selection. The touch panel 34 may include an opening 68 through which the shaft 28 may pass. It will be understood that alternatively the multiple switches may be embodied in a continuous touch wheel.

An indicator array 70 may also be included and may include an indicator 72 for each of the indicia 54 and has been illustrated as including an array of lights or light sources. The array of lights may include any suitable light sources including, by way of non-limiting examples, a plurality of LEDs, as illustrated, or a light ring, either of which may be positioned on the PCB 20 and may be operably coupled to the microprocessor 40 such that the indicator array 70 may be controlled by the microprocessor 40 to illuminate portions of the face plate 30 and the indicia 54 selected by the user. It may be understood that as the indicia 54 partially circumscribes the opening 32 and rotational axis 50 of the knob 26 so too do the indicator array 70 such that indicators 72 may visually represent how the rotary encoder 22 or multiple touch switches 62 are reacting to user input.

During assembly, the touch panel 34, PCB 20, face plate 30, and back plate 36 may be mounted to each other to form the user interface 14 and may subsequently be mounted to or within the housing 12. More specifically, the touch panel 34 may be adhered or otherwise affixed to the face plate 30. The PCB 20 may then in turn be mounted to the face plate 30 and the back plate 36 may be mounted over the PCB and may be affixed to the face plate 30 to aid in the mounting of the PCB 20 to the face plate 30. When the pieces are assembled the multiple capacitive touch switch traces 64 are aligned in such a manner that they act to form a capacitive wheel that circumscribes the opening 32 and aligns with the touch areas 66. When the pieces are assembled, an opening 75 in the back plate 36, the opening 44 on the PCB 20, the opening 68 of the touch panel 34, and the opening 32 in the face plate 30 are substantially aligned along a common axis. When the pieces are assembled it will be understood that each of the multiple switches 62 is electrically coupled to the microprocessor 40 to provide an output indicative of user selected indicia. Such electrical couplings have not been illustrated for clarity of the included illustration.

With this configuration, the user may select to use either the rotary encoder 22 with the knob 26 or the touch switches 66 as input to the controller. For purposes of this description, it is assumed that the knob 26 is not initially in place and a plug (not shown) for closing the opening 32 of the face plate 30 is inserted for aesthetic reasons. However, it is just as likely that the appliance may initially have the knob 26 mounted. Assuming the knob 26 is not mounted and the user does not desire to use the touch switches 62, then the removable knob 26 and shaft 28 may be installed. The user may do this by inserting the rotatable shaft 28 through the openings 32, 68, 44, and 75 until the shaft 28 is held in place by the back plate 36. The back plate 36 may include snaps (not shown) or similar features to aid in locating and supporting the shaft 28 and knob 26 in the proper position such that the knob 26 is not pushed into far or is not pushed in far enough. When the knob 26 is installed, the shaft 28 will also pass through the encoder body 24.

Figure 3:
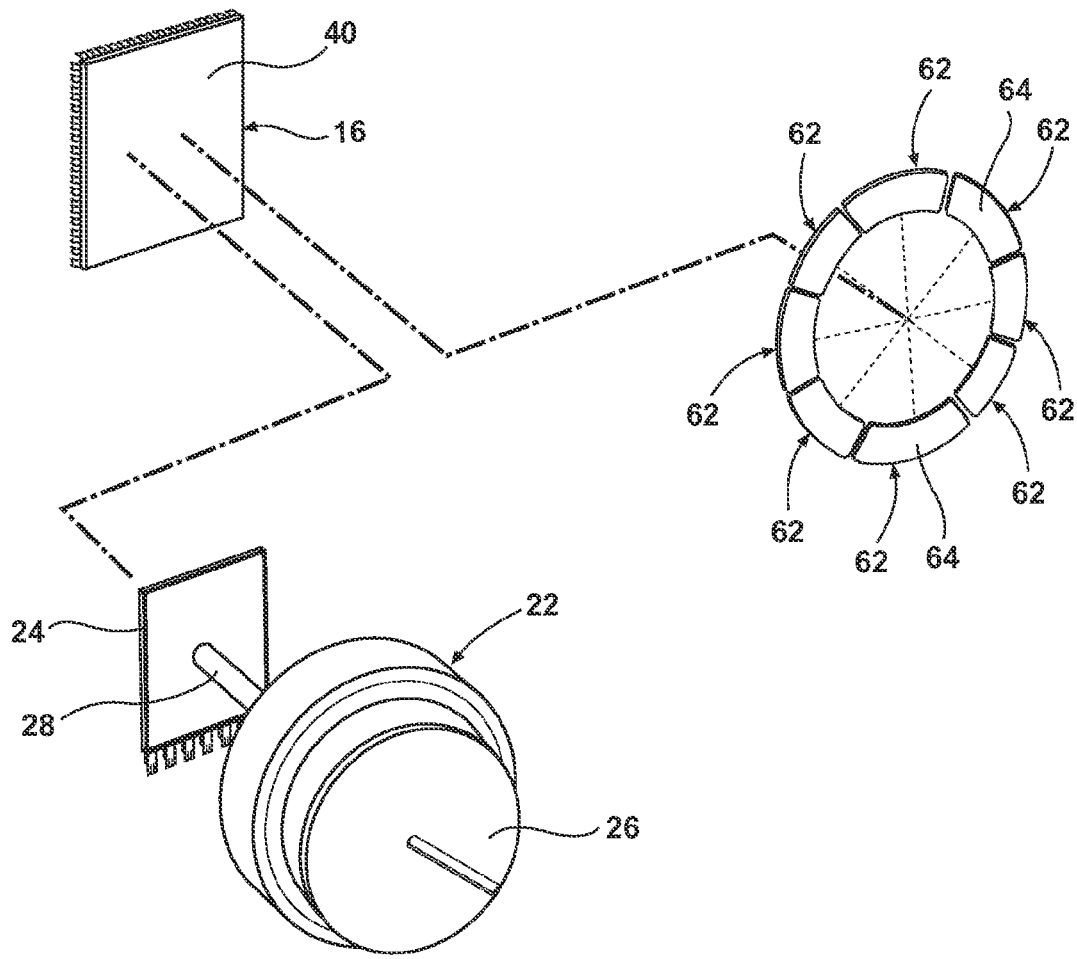
FIG. 3 is a schematic view of a portion of the user interface of the dishwasher of FIG. 1.
Figure 4:
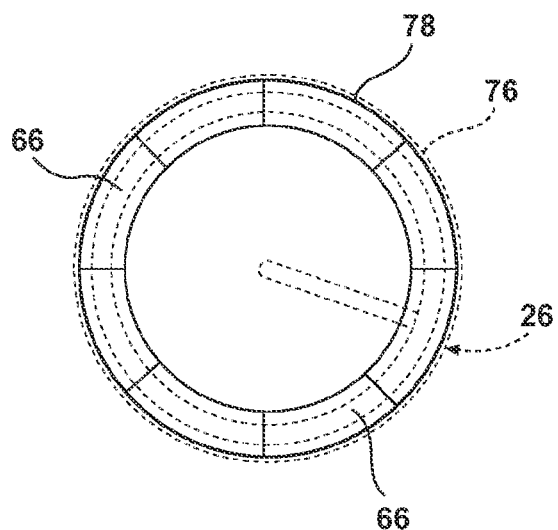
FIG. 4 is a schematic illustration of a knob and multiple switches of the user interface of FIG. 1.

It will be understood that the knob 26 may be removably mounted to the user interface 14 such that the user may select either the rotary encoder 22 or touch switches 62 for user input of the indicia, depending on the user's preference, by removing or installing the knob. FIG. 3 schematically illustrates that the microprocessor 40 accepts separate input signals from the rotary encoder 22 and the multiple switches 62. The knob 26 is configured in size and location relative to the multiple switches 62 to block access to the multiple switches 62 when it is installed. More specifically, as shown in FIG. 4, the knob 26 defines an outer periphery 76 and the multiple switches 62 define an outer periphery 78, with the outer periphery 76 of the knob 26 being greater than the outer periphery 78 of the multiple switches 62 such that when the knob 26 is installed the multiple switches 62 may be not accessed by the user. Thus, although the microprocessor 40 is capable of accepting input from both the rotary encoder 22 and the multiple switches 62 only one mechanism may be used at a time.

During operation, when the knob 26 is installed, the rotary encoder serves as a user-controlled actuator to allow the user to make selections via the user interface 14. That is, the rotary encoder 22 is used to generate a first output indicative of selected indicia that is provided to the microprocessor 40. More specifically, the rotational position of the knob 26 provides for selecting one of the indicia (i.e. cycles of operation) as it is translated by the encoder body 24 into an output indicative of, the selected indicia. For example, when the user rotates the knob 26 to a position corresponding to one of the indicia the encoder body 24 generates a signal corresponding to the selected indicia and outputs the same to the microprocessor 40. Because the knob 26 may not have a starting position, it is contemplated that the microprocessor 40 may illuminate a corresponding indicator 72 to alert the user which indicia is being selected. Light from the indicator 72 may pass through a transparent or translucent portion of the face plate 30 to signal to the user the selected option. Once the user is done rotating the knob 26 the microprocessor 40 may determine from the output signal which cycle of operation has been selected and may operate the components of the dishwasher 10 accordingly.

When the knob 26 is not installed, the multiple switches 62 formed by the touch areas 66 overlying the touch switch traces 64 may serve as the user-controlled actuator to allow the user to make selections via the user interface 14. The touch switches 62 may be sensitive to the position of one or more input objects, such as a user's finger, within or near the touch areas 66 such that the capacitive touch switches are able to detect a position or motion of the object. The capacitive touch switch detects the position of the object by detecting capacitance (e.g., changes in capacitance or absolute capacitance) that result from the location of the object and provides output regarding the position of the object to the microprocessor 40. In general, the microprocessor 40 receives electrical signals from the touch switches 62 and appropriately processes the information to accept inputs from the user to control the user interface 14. This information may be relayed from the user interface 14 to the controller 16 to control the operation of the dishwasher 10.

The apparatus described above allows the user of the appliance to select either the rotary encoder 22 or touch switches 62 for user input of the indicia depending on the user's preference by removing or installing the knob 26. The user may install the knob 26 after the appliance has been put in place if they desire to use the knob 26 instead of the touch switches 62. Or, if they would like to use the touch switches 62 then they do not need to install the knob 26. Allowing the user to select how they want to enter such selections may improve the perceived nature of the quality and functionality of the appliance without substantially increasing the cost. Further, as the knob 26 is sized and located relative to the multiple switches 62 such that it blocks access to the multiple switches the user will not be confused regarding which way information should be input. Further, as the knob 26 is not in place during installation of the appliance the shaft 28 will not be damaged during installation of the appliance.

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims. For example, the user interface and the controller may not be physically separated. In some cases one or more portions of either the user interface or the controller may be integrated with or mounted to the other. Another example is that both the encoder body and the multiple switches may be mounted to the PCB such that the touch panel may be integrated with the PCB.

What is claimed is:

1. A user interface for an appliance, comprising:
   a printed circuit board having a microprocessor for executing an operating program to implement a cycle of operation;
   a face plate overlying the printed circuit board and having indicia corresponding to user inputs, and an opening;
   a rotary encoder having a knob located relative to the face plate such that a rotational position of the knob provides for selecting one of the indicia and is electrically coupled to the microprocessor to provide a first output indicative of the selected indicia, the knob having a shaft adapted to pass through the opening;
   a plug for closing the opening when the shaft is not present in the opening; and
   a touch panel having multiple switches located relative to the face plate such that each of the switches corresponds to one of the indicia and is electrically coupled to the microprocessor to provide a second output indicative of selected indicia;
   wherein the knob is removably mounted and configured in size and location relative to the multiple switches to block access to the multiple switches thereby providing a user with the ability to select either the rotary encoder or touch panel for user input of the indicia depending on the user's preference by removing or installing the knob.

2. The user interface of claim 1 wherein the rotary encoder comprises a hollow-shaft rotary encoder.

3. The user interface of claim 1 wherein the indicia are arranged about the opening.

4. The user interface of claim 3 wherein the indicia at least partially circumscribe the opening.

5. The user interface of claim 1 wherein the multiple switches comprise multiple capacitive touch switches.

6. The user interface of claim 1 wherein the face plate comprises a glass panel overlying an indicia layer on which the indicia are provided.

7. The user interface of claim 1, further comprising an indicator array having at least one indicator for each indicia and controllable by the microprocessor for illumination of the selected indicia.

8. The user interface of claim 7 wherein the indicator array comprises an array of lights.

9. The user interface of claim 8 wherein the array of lights at least partially circumscribes a rotational axis of the knob.

10. The user interface of claim 9 wherein the indicia at least partially circumscribe the rotational axis of the knob.

11. The user interface of claim 10 wherein the knob defines an outer periphery and the multiple switches define an outer periphery, with the outer periphery of the knob being greater than the outer periphery of the multiple switches.

12. The user interface of claim 1 wherein the touch panel is integrated into the printed circuit board.

13. A household appliance comprising:
    a housing;
    a user interface provided on the housing and having a printed circuit board including a microprocessor for executing a cycle of operation of the household appliance, a face plate overlying the printed circuit board and having an opening, indicia corresponding to user inputs, and a touch panel having multiple switches located relative to the face plate such that each of the multiple switches corresponds to one of the indicia and each of the multiple switches is electrically coupled to the microprocessor to provide a first output indicative of selected indicia;
    a rotary encoder having a knob that is removably mounted to the user interface, the knob having a shaft adapted to pass through the opening; and
    a plug for closing the opening when the shaft is not present in the opening,
    wherein when the knob is mounted to the user interface the knob is located relative to the face plate such that a rotational position of the knob provides for selecting one of the indicia and is electrically coupled to the microprocessor to provide a second output indicative of the selected indicia and wherein the knob is configured in size and location relative to the multiple switches to block access to the multiple switches thereby providing a user with the ability to select either the rotary encoder or touch panel for user input of the indicia depending on the user's preference by removing or installing the knob.

14. The household appliance of claim 13 wherein the multiple switches comprise multiple capacitive touch switches.

15. The household appliance of claim 14 wherein the multiple capacitive touch switches form a capacitive wheel circumscribing the opening.

16. The household appliance of claim 13, further comprising an indicator array having at least one indicator for each indicia and controllable by the microprocessor for illumination of the selected indicia.

17. The household appliance of claim 13 wherein the household appliance includes a dishwasher.

* * * * *